US012567138B2

(12) United States Patent
Kishore Kumar

(10) Patent No.: US 12,567,138 B2
(45) Date of Patent: Mar. 3, 2026

(54) REGISTRATION METROLOGY TOOL USING DARKFIELD AND PHASE CONTRAST IMAGING

(71) Applicant: Intel Corporation, Santa Clara, CA (US)

(72) Inventor: Deepan Kishore Kumar, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 839 days.

(21) Appl. No.: 17/705,436

(22) Filed: Mar. 28, 2022

(65) Prior Publication Data

US 2023/0306579 A1 Sep. 28, 2023

(51) Int. Cl.
*G06T 7/00* (2017.01)
*G03F 1/22* (2012.01)
(Continued)

(52) U.S. Cl.
CPC ............... *G06T 7/001* (2013.01); *G03F 1/22* (2013.01); *G03F 7/7065* (2013.01); *H04N 23/45* (2023.01); *G06T 2207/30148* (2013.01)

(58) Field of Classification Search
CPC ........... G06T 7/001; G06T 2207/30148; G06T 2207/10152; G06T 1/20; G03F 1/22; G03F 7/7065; G03F 1/84; H04N 23/45; G06V 10/267; G06V 10/774; G06V 10/25; G06V 10/764; G06V 10/82
See application file for complete search history.

(56) References Cited

U.S. PATENT DOCUMENTS 5,473,157 A * 12/1995 Grober ................... G01Q 30/10
                                                          850/16
2010/0026997 A1* 2/2010 Hayashi ................. H01L 22/12
                                                          382/145
(Continued)

FOREIGN PATENT DOCUMENTS

DE      102010001604 A1 * 8/2011 ............... G02B 7/14
TW         I804591 B  *  6/2023 ......... G01N 21/8806
(Continued)

OTHER PUBLICATIONS

"Yow-Gwo Wang et al, Enhancing defect detection with Zernike phase contrast in EUV multilayer blank inspection, 2015, SPIE, 9422, Extreme Ultraviolet (EUV) Lithography V1, 94221C" (Year: 2015).*
(Continued)

*Primary Examiner* — Ming Y Hon
*Assistant Examiner* — Dominique James
(74) *Attorney, Agent, or Firm* — Viering, Jentschura & Partner mbB

(57) ABSTRACT
The present disclosure is directed to an inspection system for registration metrology and defect detection using darkfield and phase contrast imaging optical systems. The present system includes a transmitted light mode and diffracted light mode to enable imaging of low contrast features on blank EUV masks and semiconductor wafers. In an aspect, this system combines the optics for darkfield and phase contrast imaging, and may also include the optics for brightfield imaging, to provide analyzed data on registration errors and surface defects.

20 Claims, 8 Drawing Sheets

(51) Int. Cl.
  G03F 7/00 (2006.01)
  H04N 23/45 (2023.01)

(56) References Cited

U.S. PATENT DOCUMENTS

| | | | | |
|---|---|---|---|---|
| 2011/0075928 A1* | 3/2011 | Jeong | ..................... | G02B 27/58 |
| | | | | 356/521 |
| 2021/0366103 A1* | 11/2021 | Zhang | ................ | G01N 21/9501 |
| 2023/0290662 A1* | 9/2023 | Fang | ................... | G01R 31/2887 |
| 2024/0020955 A1* | 1/2024 | Frick | ......................... | G06T 3/40 |

FOREIGN PATENT DOCUMENTS

| | | | | |
|---|---|---|---|---|
| WO | WO-9201923 A1 * | 2/1992 | ............. | G01N 21/94 |
| WO | WO-2013010976 A2 * | 1/2013 | ............. | B82Y 10/00 |
| WO | WO-2019021154 A1 * | 1/2019 | ......... | G01N 21/8851 |

OTHER PUBLICATIONS

"C.E. Hamilton et al, All Solid-state, Single-Frequency 193-nm Laser System for Deep-UV Metrology, 1998,LEOS'98. 11th Annual Meeting. IEEE Lasers and Electro-Optics Society 1998 Annual Meeting (Cat. No. 98CH36243), pp. 322-323 vol. 1" (Year: 1998).*

"Waller et al., Coherence engineering, 2014 13th Workshop on Information Optics (WIO). IEEE, 2014, pp. 1-3" (Year: 2014).*

"Phillips et al., Multi-contrast imaging and digital refocusing on a mobile microscope with a domed LED array, PloS one 10.5 (2015), pp. 1-13" (Year: 2015).*

Klose, G. et al., "High-resolution and high-precision pattern placement metrology for the 45 nm node and beyond", 24th European Mask and Lithography Conference, May 2008, Dresden, Germany, 7 pages.

Klose, Gerd et al., "Photomask registration and overlay metrology by means of 193 nm optics", SPIE Photomask Technology, Oct. 2008, Monterey, California, United States, 13 pages.

Roeth, Klaus-Dieter et al., "Experimental test results of pattern placement metrology on photomasks with laser illumination source designed to address double patterning lithography challanges", SPIE Photomask Technoloy, Sep. 2009, Monterey, California, United States, 9 pages.

Beyer, Dirk et al., "The evolution of pattern placement metrology for mask making", 27th European Mask and Lithography Conference, Apr. 2011, Dresden, Germany, 10 pages.

Beyer, Dirk et al., "PROVE, the next generation registration metrology tool: status report", Photomask and Next-Generation Lithography Mask Technology XVII, May 2010, Yokohama, Japan, 8 pages.

Born, Max et al., "Principles of optics—6th ed.", 1980, Pergamon Press Ltd., Headington Hill Hall, Oxford, England, 854 pages.

* cited by examiner

400

409

408

407

401

406

405

404

403

402

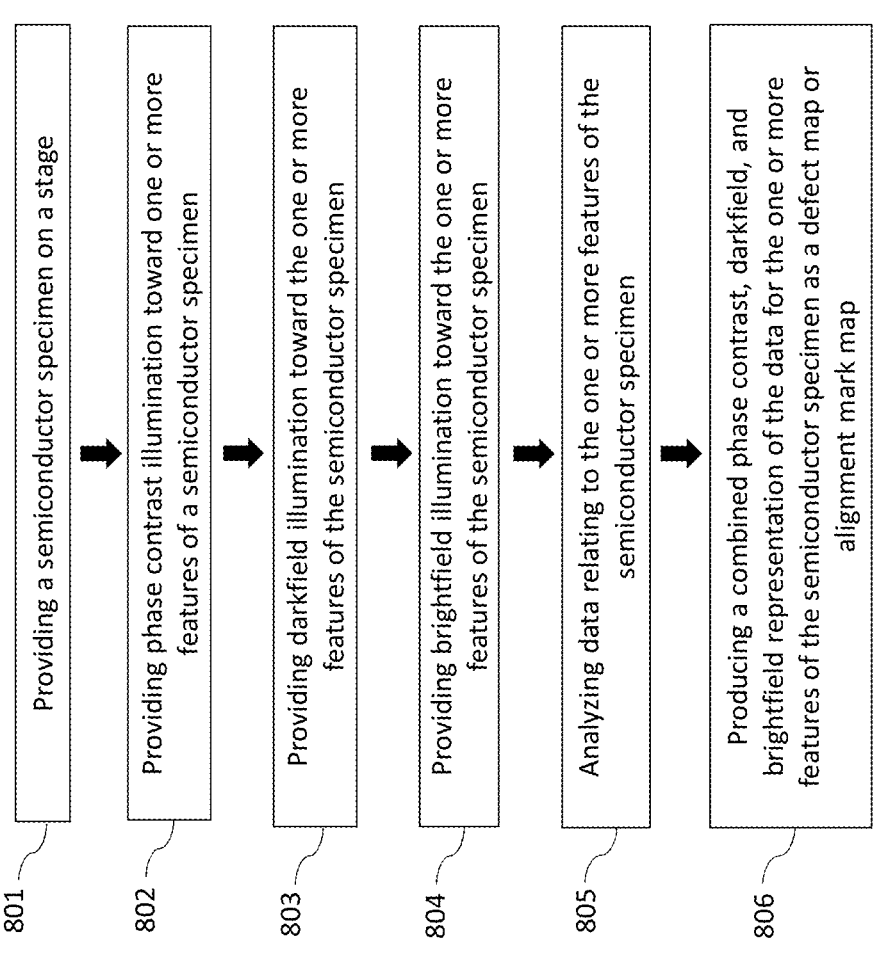

801 Providing a semiconductor specimen on a stage

802 Providing phase contrast illumination toward one or more features of a semiconductor specimen 803 Providing darkfield illumination toward the one or more features of the semiconductor specimen 804 Providing brightfield illumination toward the one or more features of the semiconductor specimen 805 Analyzing data relating to the one or more features of the semiconductor specimen 806 Producing a combined phase contrast, darkfield, and brightfield representation of the data for the one or more features of the semiconductor specimen as a defect map or alignment mark map

FIG. 8

REGISTRATION METROLOGY TOOL USING DARKFIELD AND PHASE CONTRAST IMAGING

BACKGROUND

For advanced semiconductor devices, a single layer mask exposure and etch are no longer sufficient to meet the required pattern density. As a consequence, the number of masks required to produce an integrated circuit has increased. The required patterns need to be split up and divided over multiple masks. With the increasing number of masks required to produce a semiconductor device, there have been commensurate constraints on the mask-to-mask on-product overlay requirements, controls, and inspections as well.

Before a mask is patterned and especially after the mask is patterned, the mask must undergo inspections and metrology. There are often stringent on-product overlay specifications (<3-nm) required for intra-layer (e.g., multi Litho Etch ($LE_n$) and Spacer Assisted Double/Quadruple Patterning (SADP/SAQP)) overlay performance as well as for inter-layer to layer overlay. To keep the on-product overlay within semiconductor device specification over time, the number of on-wafer overlay metrology steps inside the fab has increased. It would be beneficial to fully characterize the mask-to-mask overlay off-line and apply overlay techniques to improve the on-wafer overlay.

There are off-line metrology inspection techniques that address and reduce the overall wafer/lot cycle time inside the fab. However, current inspection techniques, for example, for detecting defects in extreme ultraviolet (EUV) blanks rely on actinic inspection, which may reduce mask lifetime. The widely used 193 nm optical inspection tools may be typically equipped with bright field imaging optics for reflection or transmission mode measurements. Such broadband brightfield imaging minimizes contrast variations and coherent noise and is not sensitive to small features and particles. These measurements work well for large features within the 10-micron range, but for process technology for smaller nodes, the next generation alignment marks may result in lower image contrast when using brightfield illumination.

There is a growing use of EUV-based phase shift masks and it would be beneficial to minimize the number of steps used in mask processing to reduce the impact on EUV photomasks. In particular, EUV phase photomasks may benefit from the use of phase contrast based alignment marks for pattern registration and overlay in view of the extreme sensitivity of EUV light to phase changes down to a single atomic layer of a phase absorber.

It is understood that inspection and metrology are the key parts of the semiconductor manufacturing process flow, because, if there is a defect of a problem on the mask, it will get printed on the final wafer. As a consequence, however, the increasing number of metrology steps may result in a negative impact on the overall wafer/lot cycle time in the fab. Accordingly, the manufacturing processes for semiconductor devices may benefit from improved techniques and systems for off-line mask-to-mask registration metrology and inspections; in particular, for EUV blank masks.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 8 shows a simplified flow diagram for an exemplary method according to an aspect of the present disclosure.

DETAILED DESCRIPTION

Figure 1:
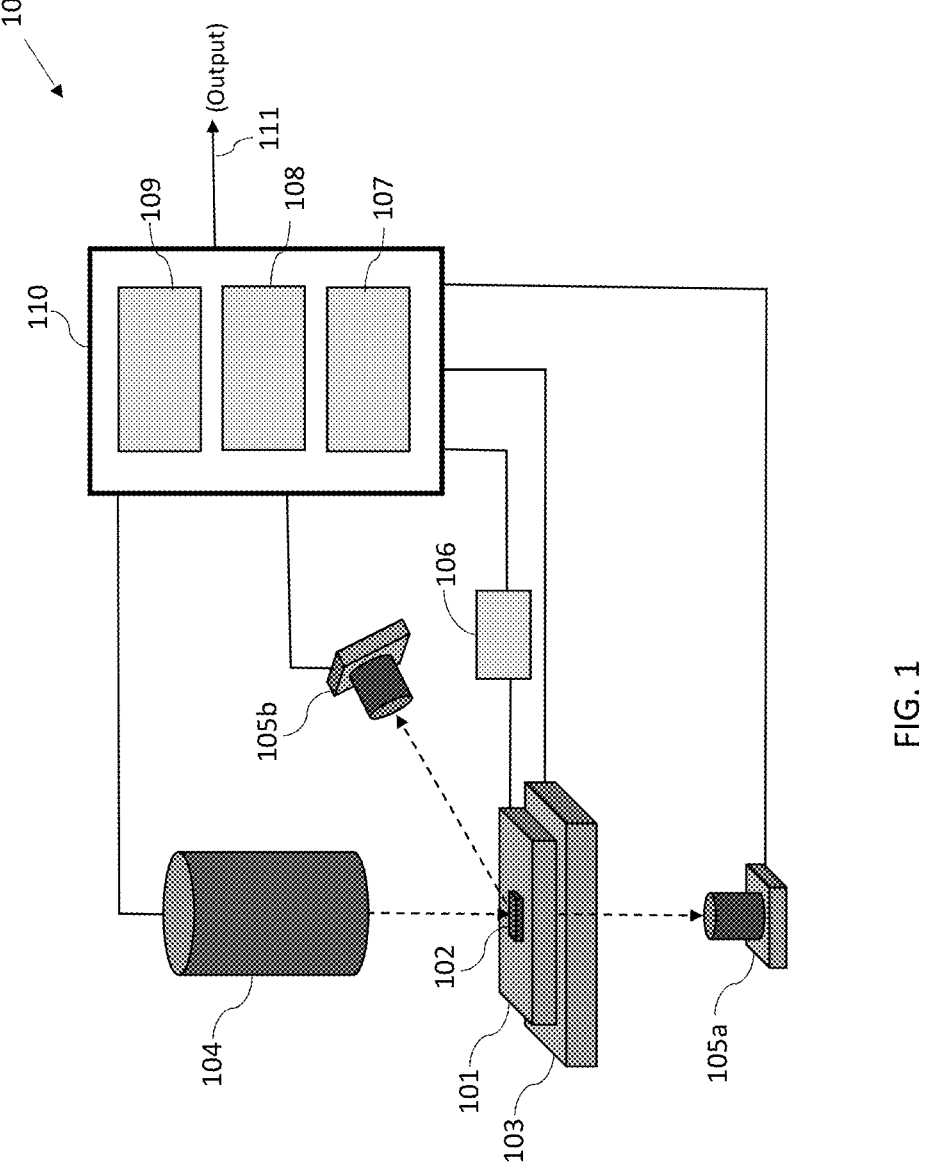
FIG. 1 shows a block diagram of an exemplary inspection/metrology system according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

Presently, conventional inspection tools may not be capable of identifying low-contrast EUV fiducial marks to correctly perform image processing to detect edges of features used for alignment and overlay in mask manufacturing. Low contrast phase defects or alignment marks are difficult to capture on brightfield imaging inspection tools and using 13.5 nm actinic inspection for alignment marks has concerns relating to degradation and mask lifetime. According to the present disclosure, the presently used brightfield imaging inspection tools with 193 nm lasers may be provided with darkfield illumination optics and/or phase contrast optics to expand the capability of these tools.

The present disclosure is directed to an inspection method that provides a semiconductor specimen with a stage for inspection and a light source to produce illumination that passes through a first optical train configured with phase contrast optical components to focus phase contrast illumination toward one or more features of the semiconductor specimen, and sensing the phase contrast illumination from the one or more features of the semiconductor specimen using a first charge-coupled device (CCD) sensor, and provides illumination through a second optical train configured with darkfield optical components to focus darkfield illumination toward the one or more features of the semiconductor specimen, and sensing the darkfield illumination from the one or more features of the semiconductor specimen using a second CCD sensor, provides position measurements using a laser interferometer, and generates analyzed data for the one or more features of the semiconductor specimen from data captured by the first and second CCD sensors and laser interferometer using a computing device.

In addition, the method may further include providing illumination through a third optical train configured with brightfield optical components to focus brightfield illumination toward the one or more features of the semiconductor specimen and sensing the field illumination from the one or more features of the semiconductor specimen using a third CCD sensor, and for which the analyzed data for the one or more features of the semiconductor specimen includes data captured by the third CCD sensor.

The present disclosure is also directed to an inspection system that includes an optical inspection tool having a stage, a light source, a first optical train configured with phase contrast optical components, a second optical train configured with darkfield optical components, and at least one CCD sensor configured to sense illumination directed from a semiconductor specimen, a laser interferometer, and a computing device. In addition, the inspection system may further include a third optical train configured with brightfield optical components.

The present disclosure is directed to an optical inspection tool including a stage, a deep ultraviolet laser emitting 193-nanometer wavelength illumination, and a multi-mode optical system including a first optical train configured with phase contrast optical components, a second optical train configured with darkfield optical components, and a third optical train configured with brightfield optical components, and at least one CCD sensor configured to sense illumination directed from a semiconductor specimen.

In addition, the present multi-mode optical system may further include a brightfield optical inspection tool that is retrofitted with phase contrast optical components, darkfield optical components, and phase contrast and darkfield CCD sensors.

It is understood that darkfield imaging collects scattered light from a defect, while brightfield imaging collects reflected light. Small, transparent defects may scatter efficiently in darkfield illumination but may be very difficult, if not impossible, to detect in brightfield. Darkfield imaging is generally useful in detecting defects having a specific height, depending upon the interaction between illumination with the geometry and effects due to transparent layers on the specimen.

By incorporating darkfield optics and phase contrast optics (such as Schwarzschild's Optics and Zernike Phase Contrast optics), according to the present disclosure, it is possible to detect smaller phase defects within a multi-layer stack of a blank EUV mask and lower (poor) contrast EUV alignment marks using a 193 nm excitation source.

To more readily understand and put into practical effect, the present registration metrology tool using brightfield, darkfield and phase contrast imaging, and methods which may be used for inspecting semiconductor specimens, such as blank EUV masks and semiconductor wafer, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, according to an aspect of the present disclosure, an inspection system 100 is shown. The present inspection system 100 may include an optical microscope tool (not shown) used to inspect a mask or wafer 101, which may have a registration feature 102 (or a defect). In an aspect, the mask or wafer 101, as a device under test or DUT, may be positioned on a stage or platform 103 for illumination by inspection system optical components 104 (i.e., darkfield, phase contrast and brightfield optical components, and a single or multiple light sources). In an aspect, the light source (not shown) may be a laser with a 193 nm wavelength. The present inspection system 100 may be one or more image sensors, which are shown as charge-coupled device (CCD) detector/camera 105a (used in reflected light mode) and CCD detector/camera 105b (used in transmitted light mode).

In another aspect shown in FIG. 1, a laser interferometer system 106 may be provided for the present inspection system 100 to generate positional/location data. An exemplary laser interferometer is described in FIG. 6 below.

In yet another aspect, the various subsystem of the present inspection system 100 may be coupled to a processor or computing device 110, which may include a control unit 107 a measurement data analyzer 108, and a data storage/capture unit 109, and generate analyzed data (e.g., registration data) as an output signal 111. It is within the scope of the present disclosure to provide the processor 110 as an integrated unit, or as a standalone computing device or workstation. In addition, the data storage unit 109 may provide idealized images for standard blank EUV masks and/or semiconductor wafers that may be used for comparison with the measured data.

In addition, it is within the scope of the present disclosure to have incorporated other functional units as part of the present inspection system; for example, a design data generation unit, a data converting unit, an inspection data capture unit, an inspection data correcting unit, an image converting unit, a position accuracy measuring unit, a measurement results obtaining/capturing unit, a defect storing unit, an image obtaining unit, an auto-focus unit, etc.

In an aspect, according to the present disclosure, the inspection system 100 may use software with pre-programmed patterns for the scanning of surfaces of a mask or wafer, which may be stored in the data storage unit 109 or remotely in a server (not shown). The use of pre-programmed patterns may permit the scans to be performed in an automated process and provide for generating selective scans of greater or lesser details as needed. In an aspect, a control software may be used to control the operations and movements of the inspection system (e.g., movement of the stage 103 in the x-direction, y-direction, and z-direction, focusing of the microscope, etc). In another aspect, the present inspection system 100 may employ image analysis software for analyzing the captured data and generating data output and maps.

In yet another aspect, the present inspection system 100 may include a user interface (not shown) to provide inputs to the inspection system to initiate automated scans, for modifying the automated scans, for manually scanning of a mask or wafer, etc.

It is within the scope of the present inspection system 100 of FIG. 1 to perform full processing of a blank EUV mask or wafer using various sequences for combining darkfield imaging and phase contrast imaging and/or combining dark-field imaging, phase contrast imaging, and brightfield imaging, i.e., either simultaneously or sequentially. In an aspect, an inspection may be performed by first obtaining registration information using the brightfield imaging and using the data from the darkfield and/or phase contrast imaging to correlate/correct any registration errors to improve the accuracy of the analyzed data and the generated output map. In situations when a brightfield image is not viable, then the darkfield image and/or phase image may be relied solely to locate the center of the registration alignment marks.

Figure 2:
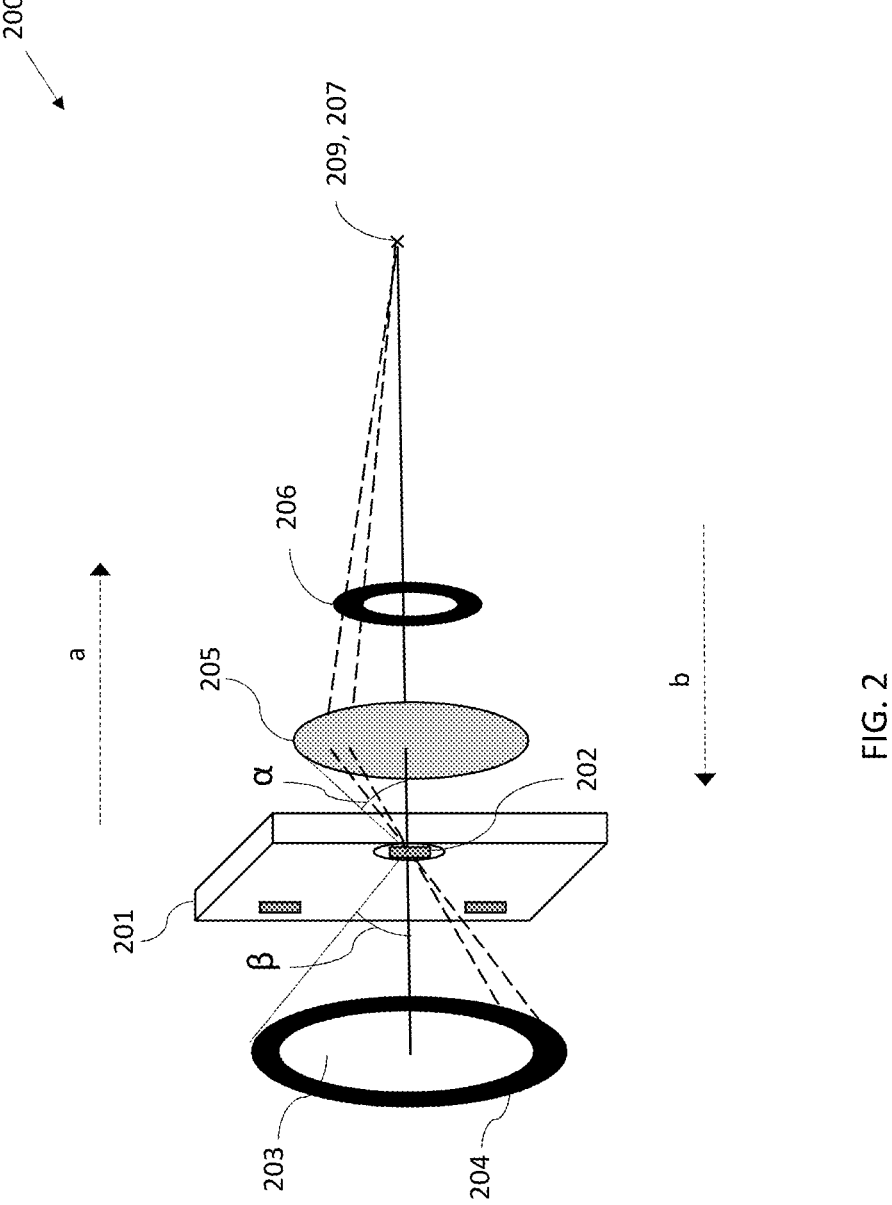
FIG. 2 shows a schematic diagram of an exemplary optical train according to an aspect of the present disclosure.

FIG. 2 shows a schematic diagram of an exemplary optical train 200 that may be used with the present inspection system according to an aspect of the present disclosure. As shown, a semiconductor specimen or DUT 201 may have a registration mark or defect 202 with illumination impinging on and/or passing through a condenser lens 203, a light annular detector 204, an objective lens 205, and a scanning phase ring 206, and there may be an image 207 or light source 209 depending on the operational direction. In an aspect, the present optical train 200 may provide, when operational viewed from left to right (i.e., in direction a), a "full-field" Zernike phase contrast imaging may be obtained. In another aspect, the present optical train 200 may provide, when operational viewed from right to left (i.e., in direction b), a "scanning" Zernike phase contrast imaging. The present inspection system may use optical train 200 for microscopes that are configured according to the present disclosure since they are mathematically equivalent and produce the same images if the optics angles β and α shown in FIG. 2 are the same.

Figure 3:
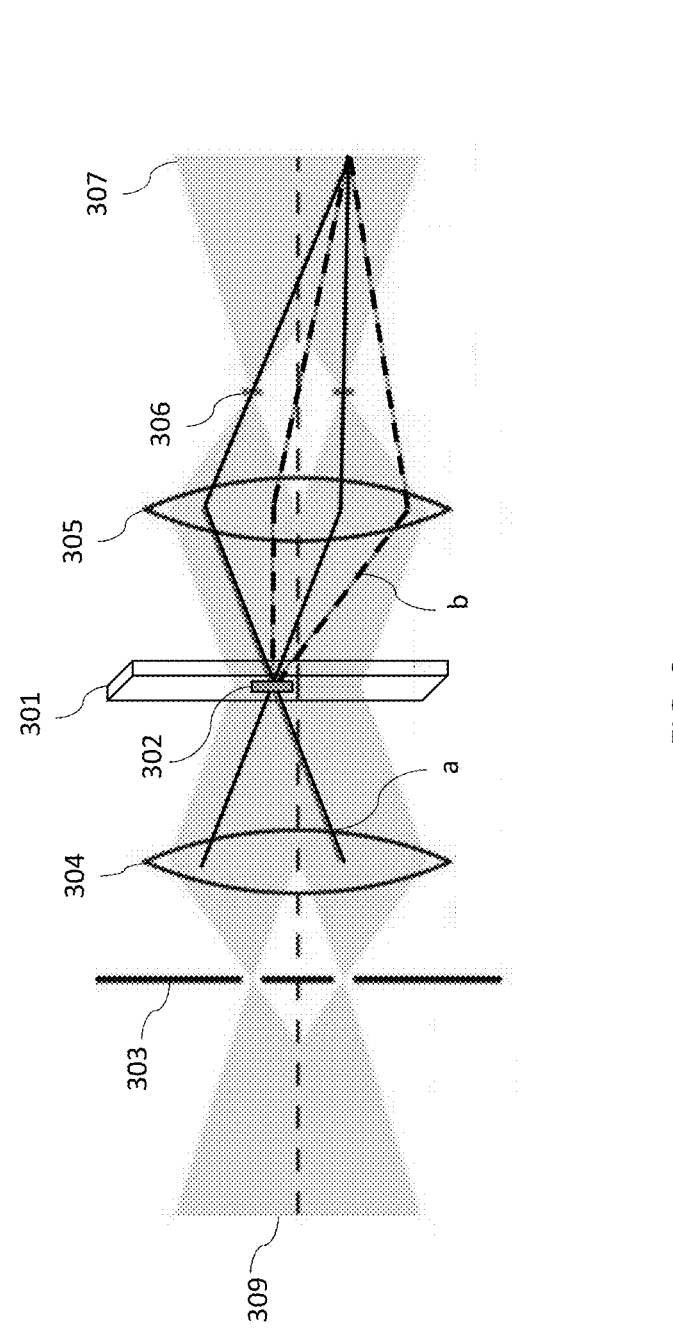
FIG. 3 shows a schematic diagram of another exemplary optical train according to another aspect of the present disclosure.

FIG. 3 shows a schematic diagram of another exemplary optical train 300 that may be used with the present inspection system according to another aspect of the present disclosure. In an aspect, a light source 309 may provide illumination that passes through an annular aperture 303 and a condenser lens 304 to impinge on and/or pass through specimen 301 with a registration mark or defect 302. Thereafter, as shown in FIG. 3, from the illumination, undiffracted light "a" (solid) and diffracted light b (dashed) may be produced that are directed to and collected by an objective lens 305. In an aspect, there will be interference between the undiffracted and diffracted light and their phase shifted by a phase ring 306, which translates into phase variations, i.e., intensity modulations in the image plane 307.

It will be understood that the most important concept underlying the design of a phase contrast microscope for the present inspection system is the segregation of surround and diffracted wavefronts emerging from a specimen, which are projected onto different locations in an objective positioned near a rear focal plane. In addition, the amplitude of the surround (undiffracted) light must be reduced by a phase ring or plate, and the phase advanced or retarded (by a quarter wavelength by the specimen) in order to maximize differences in intensity between the specimen and background in the image plane.

Figure 4:
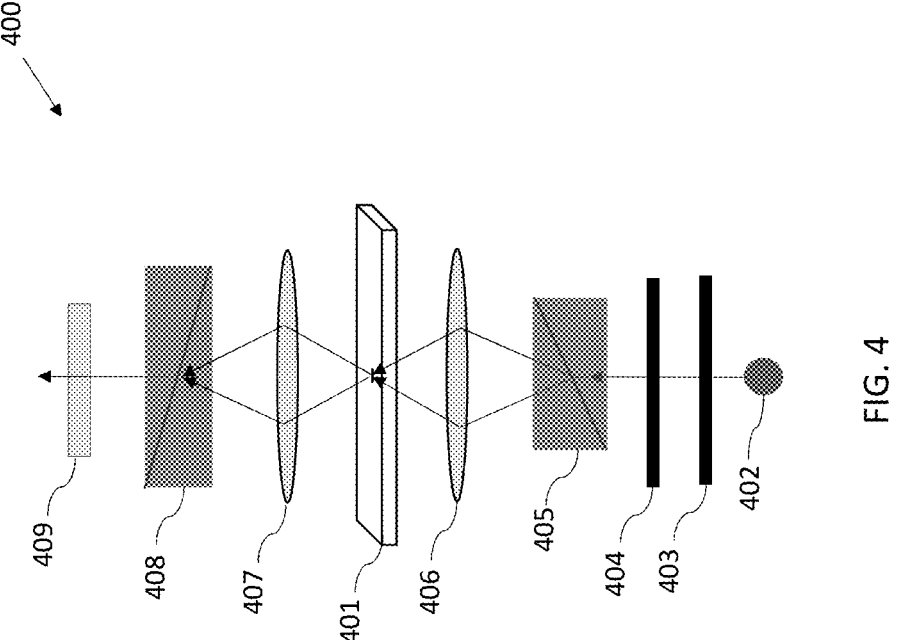
FIG. 4 shows a schematic diagram of yet another exemplary optical train according to another aspect of the present disclosure.

FIG. 4 shows a schematic diagram of a further exemplary optical train 400 that may be used with the present inspection system according to further aspects of the present disclosure. In FIG. 4, the optical train 400 may be provided for phase contrast imaging of a semiconductor specimen 401 and may include illumination from a light source (non-polarized) 402 that follows a path through a polarizer 403, a quarter waveplate 404, an objective prism 405, a condenser 406, passing through the semiconductor specimen 401 and continuing through to an objective 407, a nosepiece prism 408 and an analyzer 409. In this aspect, the path of the illumination may be "dual channel" as it passes through the semiconductor specimen 401, which may preferably have equal intensity as they impinge on the specimen surface. The objective prism 405 may divide the illumination into first and second channels.

Figure 5:
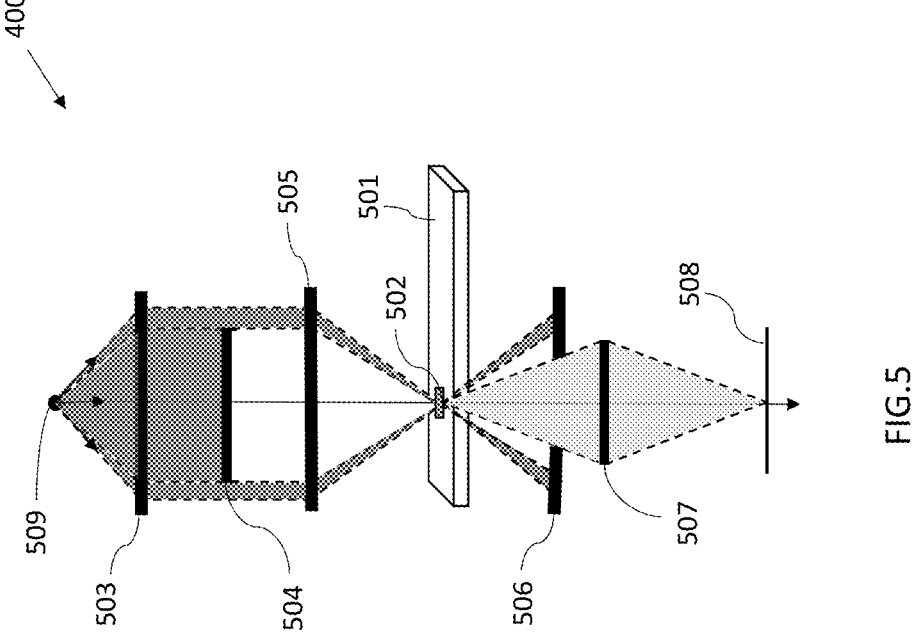
FIG. 5 shows a schematic diagram of a further exemplary optical train according to further aspects of the present disclosure.

FIG. 5 shows a schematic diagram of yet another exemplary optical train 500 that may be used with the present inspection system according to another aspect of the present disclosure. In this aspect, the optical train 500 may employ Schwarzschild optics for darkfield imaging of a semiconductor specimen 501 having a registration mark or defect 502. Schwarzschild objectives are increasingly used in the EUV spectral region as imaging optics because of their large aperture, high mechanical stability, and freedom from chromatic aberrations.

As shown in FIG. 5, a light source 509 may provide illumination directed to a collector 503, with a central aperture 504 blocking a central portion of the illumination (aka the zeroth order mode of the light). The unblocked portion (aka first order and higher order mode of light) of the illumination may be further directed to a condenser 505, which, in turn, directs it to the semiconductor specimen 501. The undiffracted illumination may be blocked by an objective aperture 506, while the diffracted lamination may be refocused by an objective 507 and directed to a darkfield image plane 508.

Figure 6:
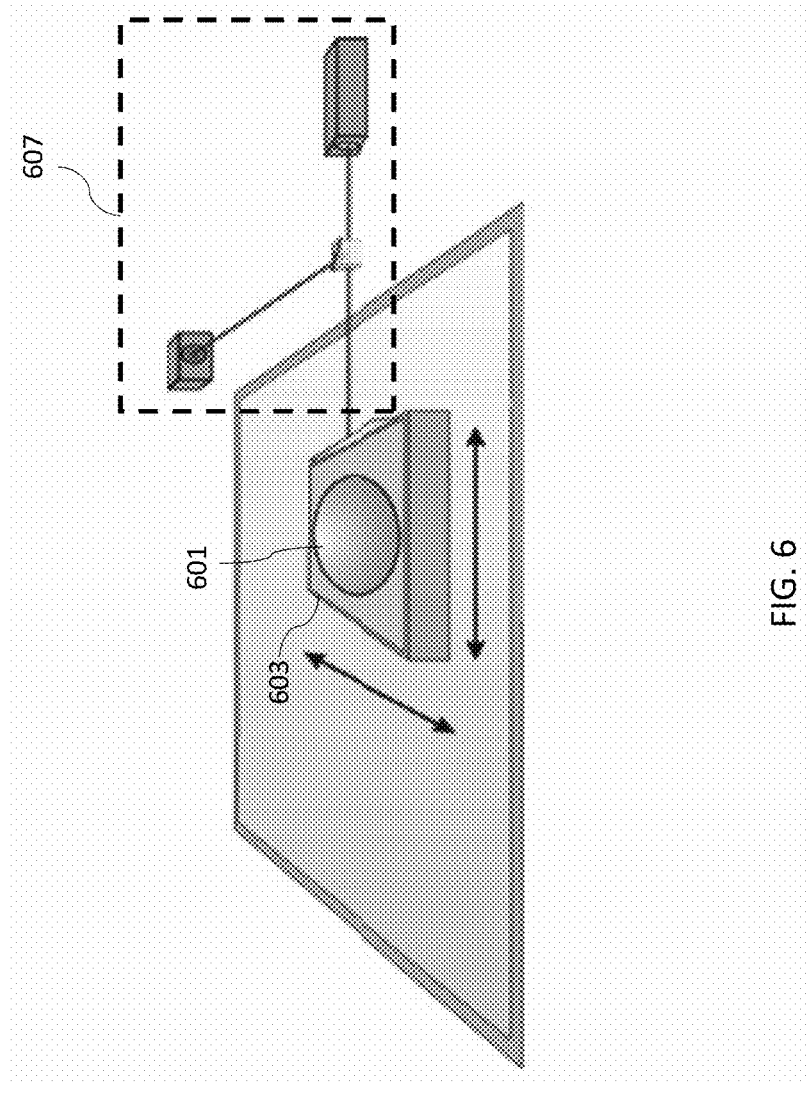
FIG. 6 shows an exemplary laser interferometer system according to an aspect of the present disclosure.

In FIG. 6, an exemplary laser interferometer system 607 according to an aspect of the present disclosure is shown. The laser interferometer system 607 may provide highly accurate measurements of the movements of a stage 603, which supports a semiconductor specimen 601, that may be directed by a precision motion control device (not shown). In an aspect, the laser interferometer measurements may be positioned near a stage's work point to act as a feedback mechanism for the precision motion control device. In an aspect, the data from a laser interferometer system may be combined with optical data from brightfield, darkfield, and phase contrast images to provide information relating to registration errors and/or defects.

Figure 7A:
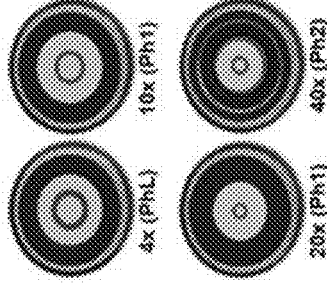
FIGS. 7A, 7B, and 7C show diagrams of exemplary optical subcomponents according to an aspect of the present disclosure.
Figure 7B:
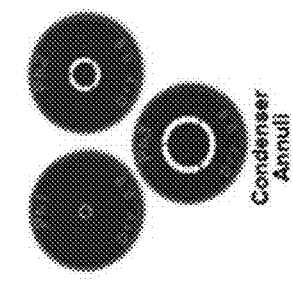
Figure 7C:
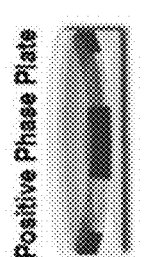
Figure 7C:

FIGS. 7A, 7B, and 7C show diagrams of exemplary optics subcomponents for phase contrast illumination according to an aspect of the present disclosure. In FIG. 7A, exemplary objectives apertures are shown. In FIG. 7B, exemplary condenser annuluses are shown. In FIG. 7C, exemplary negative and positive phase plates are shown. These optical subcomponents may be used to provide the phase shifting needed for phase contrast illumination.

In a further aspect, to potentially perform a retrofit of a typical inspection/registration metrology tool, it may be possible to convert a brightfield microscope for phase contrast observation by, among other things, providing a specially designed annular diaphragm, which is matched in diameter and optically conjugate to an internal phase plate residing in the objective rear focal plane that is placed in the condenser front focal plane. For darkfield imaging, a brightfield beamsplitter may need to be removed and preferably replaced with a blank, or glass, when performing darkfield illumination, which allows more light to pass to a sensor and permits greater levels of detection in darkfield imaging. An alternative method for producing the same result is to perform brightfield imaging in a selected wavelength of light (e.g., 13.5 nm EUV light source, 193 nm ArF Excimer laser or 266 nm, etc) or perform darkfield imaging in a different frequency light spectrum (e.g., 355 nm 532 nm, 1064 nm which are harmonics of a Nd:YAG laser).

FIG. 8 shows a simplified flow diagram for an exemplary method according to an aspect of the present inspection system.

The operation 801 may be directed to providing a semiconductor specimen on a stage.

The operation 802 may be directed to providing phase contrast illumination toward one or more features of a semiconductor specimen.

The operation 803 may be directed to providing darkfield illumination toward the one or more features of the semiconductor specimen.

The operation 804 may be directed to providing brightfield illumination toward the one or more features of the semiconductor specimen.

The operation 805 may be directed to analyzing data relating to the one or more features of the semiconductor specimen.

The operation 806 may be directed to producing a combined phase contrast, darkfield, and brightfield representation of the data for the one or more features of the semiconductor specimen as a defect map or alignment mark map.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present metrology system and methods for their use in gap measurements, they will now be described by way of examples. For the sake of brevity, duplicate descriptions of features and properties may be omitted.

EXAMPLES

Example 1 provides an inspection method that includes providing a semiconductor specimen on a stage for inspection, providing a light source to produce illumination, providing illumination through a first optical train configured with phase contrast optical components to focus phase contrast illumination toward one or more features of the semiconductor specimen, and sensing the phase contrast illumination from the one or more features of the semiconductor specimen using a first charge-coupled device (CCD) sensor, providing illumination through a second optical train configured with darkfield optical components to focus darkfield illumination toward the one or more features of the semiconductor specimen, and sensing the darkfield illumination from the one or more features of the semiconductor specimen using a second CCD sensor, providing position measurements using an laser interferometer, and generating analyzed data for the one or more features of the semiconductor specimen from data captured by the first and second CCD sensors and laser interferometer using a computing device.

Example 2 may include the method of example 1 and/or any other example disclosed herein, further includes providing illumination through a third optical train configured with brightfield optical components to focus brightfield illumination toward the one or more features of the semiconductor specimen, and sensing the field illumination from the one or more features of the semiconductor specimen using a third CCD sensor, and for which the analyzed data for the one or more features of the semiconductor specimen includes data captured by the third CCD sensor.

Example 3 may include the method of example 2 and/or any other example disclosed herein, for which the semiconductor specimen further includes a blank extreme ultraviolet (EUV) mask and for which the one or more features further includes alignment marks or surface defects on the blank EUV mask.

Example 4 may include the method of example 3 and/or any other example disclosed herein, for which the data analyzing for the alignment marks or surface defects on the blank EUV mask provides for comparisons of stored data for an ideal image for a standardized blank EUV mask.

Example 5 may include the method of example 4 and/or any other example disclosed herein, further includes for which the data analyzing includes producing a combined multi-mode phase contrast, darkfield, and brightfield representation of the blank EUV mask as a defect map or alignment mark map.

Example 6 may include the method of example 2 and/or any other example disclosed herein, for which the semiconductor specimen further includes a blank semiconductor wafer and for which the one or more features further includes surface defects on the blank semiconductor wafer.

Example 7 may include the method of example 6 and/or any other example disclosed herein, for which the data analyzing for surface defects on the blank semiconductor wafer provides for comparisons with stored data for an ideal image for a standardized blank semiconductor wafer.

Example 8 may include the method of example 7 and/or any other example disclosed herein, for which the data analyzing further includes producing a combined multi-mode phase contrast, darkfield, brightfield representation of the blank semiconductor mask as a defect map.

Example 9 may include the method of example 1 and/or any other example disclosed herein, for which the providing the semiconductor specimen further includes providing an assembled semiconductor device as the semiconductor specimen for inspection, for which the inspection is performed upon the completion of designated assembly process steps for the assembled semiconductor.

Example 10 may include the method of example 1 and/or any other example disclosed herein, further includes providing a pre-programmed pattern for automated scanning of surfaces of the semiconductor specimen.

Example 11 provides an inspection system that includes an optical inspection tool including a stage, a light source, a first optical train configured with phase contrast optical components, a second optical train configured with darkfield optical components, and at least one CCD sensor configured to sense illumination directed from a semiconductor specimen, a laser interferometer, and a computing device.

Example 12 may include the inspection system of example 11 and/or any other example disclosed herein, for which the optical inspection tool further includes a third optical train configured with brightfield optical components.

Example 13 may include the inspection system of example 11 and/or any other example disclosed herein, for which the first optical train further includes Zernike optical components.

Example 14 may include the inspection system of example 11 and/or any other example disclosed herein, for which the second optical train further includes Schwarzchild optical components.

Example 15 may include the inspection system of example 11 and/or any other example disclosed herein, for which the computing device further includes a system control unit, a measurement data analyzer, and a data storage unit.

Example 16 may include the inspection system of example 11 and/or any other example disclosed herein, for which the semiconductor specimen further includes a blank EUV mask with one or more alignment marks and/or defects or a blank semiconductor wafer with one or more surface defects.

Example 17 may include the inspection system of example 11 and/or any other example disclosed herein, for which the computing device provides an output comprising two dimensional maps with both phase contrast data and darkfield data.

Example 18 may include the inspection system of example 12 and/or any other example disclosed herein, for which the computing device provides an output comprising two dimensional maps with combined phase contrast data, darkfield data, and brightfield data.

Example 19 provides an optical inspection tool including a stage, a deep ultraviolet laser emitting 193-nanometer wavelength illumination, and a multi-mode optical system including a first optical train configured with phase contrast optical components, a second optical train configured with darkfield optical components, and a third optical train configured with brightfield optical components, and at least one CCD sensor configured to sense illumination directed from a semiconductor specimen.

Example 20 may include the optical inspection tool of claim 19 and/or any other example disclosed herein, for which the multi-mode optical system further includes a brightfield optical inspection tool that is retrofitted with phase contrast optical components, darkfield optical components, and phase contrast and darkfield CCD sensors.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An inspection method comprising:
   providing a semiconductor specimen on a stage for inspection;
   providing a light source to produce illumination;
   providing, from the light source, illumination through a first optical train configured with phase contrast optical components to focus phase contrast illumination toward one or more features of the semiconductor specimen, and sensing the phase contrast illumination from the one or more features of the semiconductor specimen using a first charge-coupled device (CCD) sensor;

providing, from the light source, illumination through a second optical train configured with darkfield optical components to focus darkfield illumination toward the one or more features of the semiconductor specimen, and sensing the darkfield illumination from the one or more features of the semiconductor specimen using a second CCD sensor;

providing position measurements using a laser interferometer; and generating analyzed data for the one or more features of the semiconductor specimen from data captured by the first and second CCD sensors and laser interferometer using a processor;

wherein the providing, from the light source, illumination through the first optical train and the providing, from the light source, illumination through the second optical train occur simultaneously.

2. The method of claim 1, further comprising:
   providing, from the light source, illumination through a third optical train configured with brightfield optical components to focus brightfield illumination toward the one or more features of the semiconductor specimen, and sensing the field illumination from the one or more features of the semiconductor specimen using a third CCD sensor; and
   wherein the analyzed data for the one or more features of the semiconductor specimen includes data captured by the third CCD sensor.

3. The method of claim 2, wherein the semiconductor specimen further comprises a blank extreme ultraviolet (EUV) mask and wherein the one or more features further comprises alignment marks or surface defects on the blank EUV mask.

4. The method of claim 3, wherein the data analyzing for the alignment marks or surface defects on the blank EUV mask provides for comparisons of stored data for an ideal image for a standardized blank EUV mask.

5. The method of claim 4, wherein the data analyzing comprises producing a combined multi-mode phase contrast, darkfield, and brightfield representation of the blank EUV mask as a defect map or alignment mark map.

6. The method of claim 2, wherein the semiconductor specimen further comprises a blank semiconductor wafer and wherein the one or more features further comprises surface defects on the blank semiconductor wafer.

7. The method of claim 6, wherein the data analyzing for surface defects on the blank semiconductor wafer provides for comparisons with stored data for an ideal image for a standardized blank semiconductor wafer.

8. The method of claim 7, wherein the data analyzing further comprises producing a combined multi-mode phase contrast, darkfield, brightfield representation of the blank semiconductor mask as a defect map.

9. The method of claim 1, wherein the providing the semiconductor specimen further comprises providing an assembled semiconductor device as the semiconductor specimen for inspection, wherein the inspection is performed upon the completion of designated assembly process steps for the assembled semiconductor.

10. The method of claim 1, further comprises providing a pre-programmed pattern for automated scanning of a surface of the semiconductor specimen.

11. An inspection system comprising:

an optical inspection tool comprising:

a stage;

a light source configured to produce illumination;

a first optical train configured to receive illumination from the light source and direct illumination from the light source toward a semiconductor specimen, wherein the first optical train is configured with phase contrast optical components;

a second optical train configured to receive illumination from the light source and direct illumination from the light source toward the semiconductor specimen, wherein the second optical train is configured with darkfield optical components; and at least one CCD sensor configured to sense illumination directed from the semiconductor specimen;

a laser interferometer; and a processor.

12. The inspection system of claim 11, wherein the optical inspection tool further comprises a third optical train configured to receive illumination from the light source and direct illumination from the light source toward the semiconductor specimen, wherein the third optical train is configured with brightfield optical components.

13. The inspection system of claim 11, wherein the first optical train further comprises Zernike optical components.

14. The inspection system of claim 11, wherein the second optical train further comprises Schwarzchild optical components.

15. The inspection system of claim 11, wherein the semiconductor specimen further comprises a blank EUV mask with one or more alignment marks and/or defects, or a blank semiconductor wafer with one or more surface defects.

16. The inspection system of claim 11, wherein the processor provides an output comprising two dimensional maps with both phase contrast data and darkfield data.

17. The inspection system of claim 12, wherein the processor provides an output comprising two dimensional maps with combined phase contrast data, darkfield data, and brightfield data.

18. An optical inspection tool comprising:

a stage;

a deep ultraviolet laser emitting 193-nanometer wavelength illumination; and a multi-mode optical system comprising:

a first optical train configured to receive illumination from the deep ultraviolet laser and direct illumination from the deep ultraviolet laser toward a semiconductor specimen, wherein the first optical train is configured with phase contrast optical components;

a second optical train configured to receive illumination from the deep ultraviolet laser and direct illumination from the deep ultraviolet laser toward the semiconductor specimen, wherein the second optical train is configured with darkfield optical components; and a third optical train configured to receive illumination from the deep ultraviolet laser and direct illumination from the deep ultraviolet laser toward the semiconductor specimen, wherein the third optical train is configured with brightfield optical components; and at least one CCD sensor configured to sense illumination directed from the semiconductor specimen.

19. The optical inspection tool of claim 18, wherein the multi-mode optical system further comprises a brightfield optical inspection tool that is retrofitted with phase contrast optical components, darkfield optical components, and phase contrast and darkfield CCD sensors.

20. The inspection system of claim 11, wherein the optical components of the first optical train are different than the optical components of the second optical train.

* * * * *